United States Patent
Tone et al.

(10) Patent No.: US 10,121,631 B2
(45) Date of Patent: Nov. 6, 2018

(54) CHARGED PARTICLE BEAM DEVICE PROVIDED WITH ION PUMP

(71) Applicant: HITACHI HIGH-TECHNOLOGIES CORPORATION, Minato-ku, Tokyo (JP)

(72) Inventors: Masazumi Tone, Tokyo (JP); Hiroshi Touda, Tokyo (JP); Fujio Onishi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/570,803

(22) PCT Filed: May 1, 2015

(86) PCT No.: PCT/JP2015/063145
§ 371 (c)(1),
(2) Date: Oct. 31, 2017

(87) PCT Pub. No.: WO2016/178283
PCT Pub. Date: Nov. 10, 2016

(65) Prior Publication Data
US 2018/0158648 A1   Jun. 7, 2018

(51) Int. Cl.
*H01J 37/24* (2006.01)
*H01J 37/18* (2006.01)
(Continued)

(52) U.S. Cl.
CPC .......... *H01J 37/241* (2013.01); *H01J 37/08* (2013.01); *H01J 37/18* (2013.01); *H01J 37/222* (2013.01);
(Continued)

(58) Field of Classification Search
USPC ........................................ 250/310
See application file for complete search history.

(56) References Cited

U.S. PATENT DOCUMENTS

| | | | |
|---|---|---|---|
| 2008/0067378 A1* | 3/2008 | Kawasaki | H01J 37/153 250/310 |
| 2011/0089336 A1* | 4/2011 | Kasuya | H01J 37/073 250/424 |

FOREIGN PATENT DOCUMENTS

| | | |
|---|---|---|
| JP | 06-044943 A | 2/1994 |
| JP | 11-177839 A | 7/1999 |
| JP | 2014-099348 A | 5/2014 |

* cited by examiner

*Primary Examiner* — Kiet T Nguyen
(74) *Attorney, Agent, or Firm* — Miles & Stockbridge P.C.

(57) ABSTRACT

In a charged particle apparatus with an ion pump, which is a charged particle beam apparatus with an ion pump including a charged particle beam irradiation detecting unit for irradiating a sample with a charged particle beam in a chamber and detecting a secondary charged particle, an image processing unit for forming a secondary charged particle image from a detection signal of the detected secondary charged particle, an output unit for processing at the image processing unit and outputting an image, an ion pump for maintaining the interior of the processing chamber in a vacuum state, a driving power supply unit of the ion pump, and a high voltage cable for connecting the ion pump and the driving power supply unit, the driving power supply unit of the ion pump is structured to include a high voltage power supply circuit unit for operating the ion pump, a load current detection circuit unit for detecting a load current applied to the ion pump, and a canceller circuit unit for reducing low frequency noise applied to the load current detection circuit unit in order to sufficiently reduce low frequency noise of the power supply of the ion and to measure the degree of vacuum with a high accuracy.

12 Claims, 5 Drawing Sheets

(51) Int. Cl.
*H01J 37/248* (2006.01)
*H01J 37/28* (2006.01)
*H01J 37/08* (2006.01)
*H01J 37/22* (2006.01)
*H01J 37/244* (2006.01)
*H01J 37/26* (2006.01)

(52) U.S. Cl.
CPC .......... *H01J 37/244* (2013.01); *H01J 37/248* (2013.01); *H01J 37/26* (2013.01); *H01J 37/28* (2013.01); *H01J 2237/2448* (2013.01)

F I G . 2
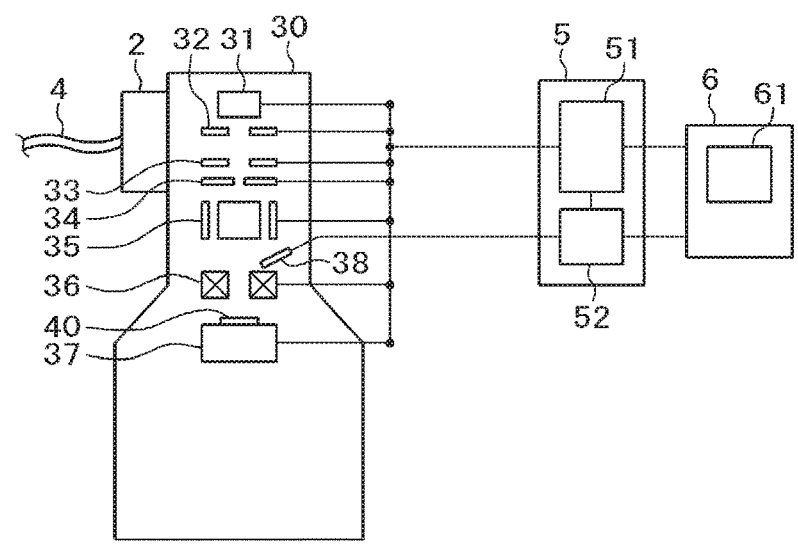
F I G . 3
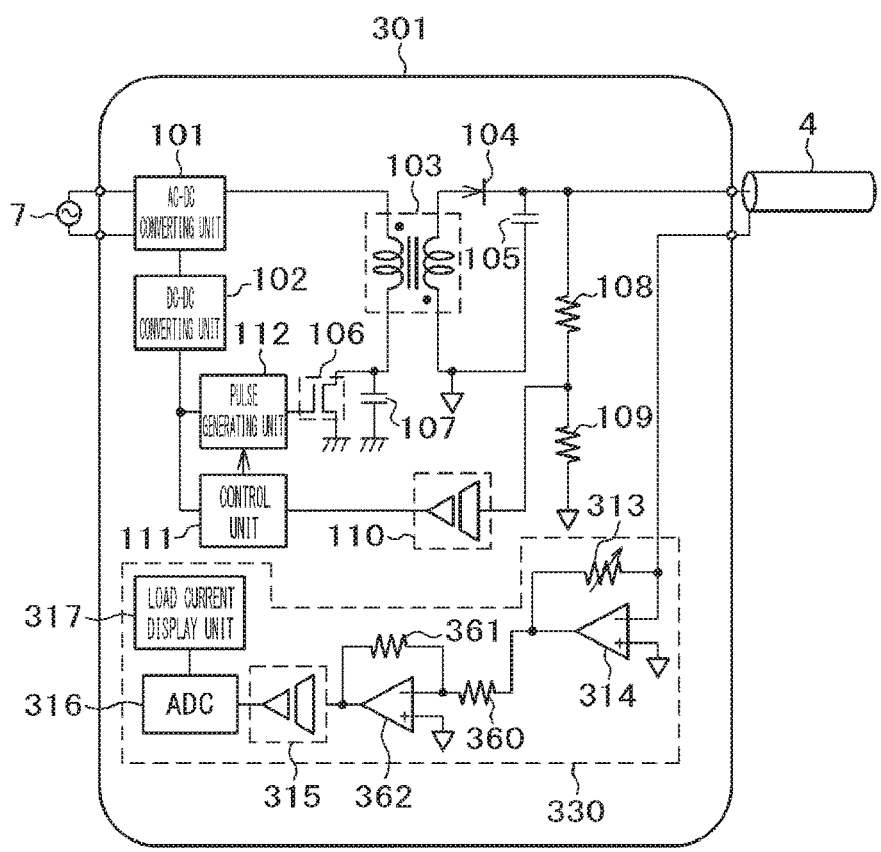

F I G . 7
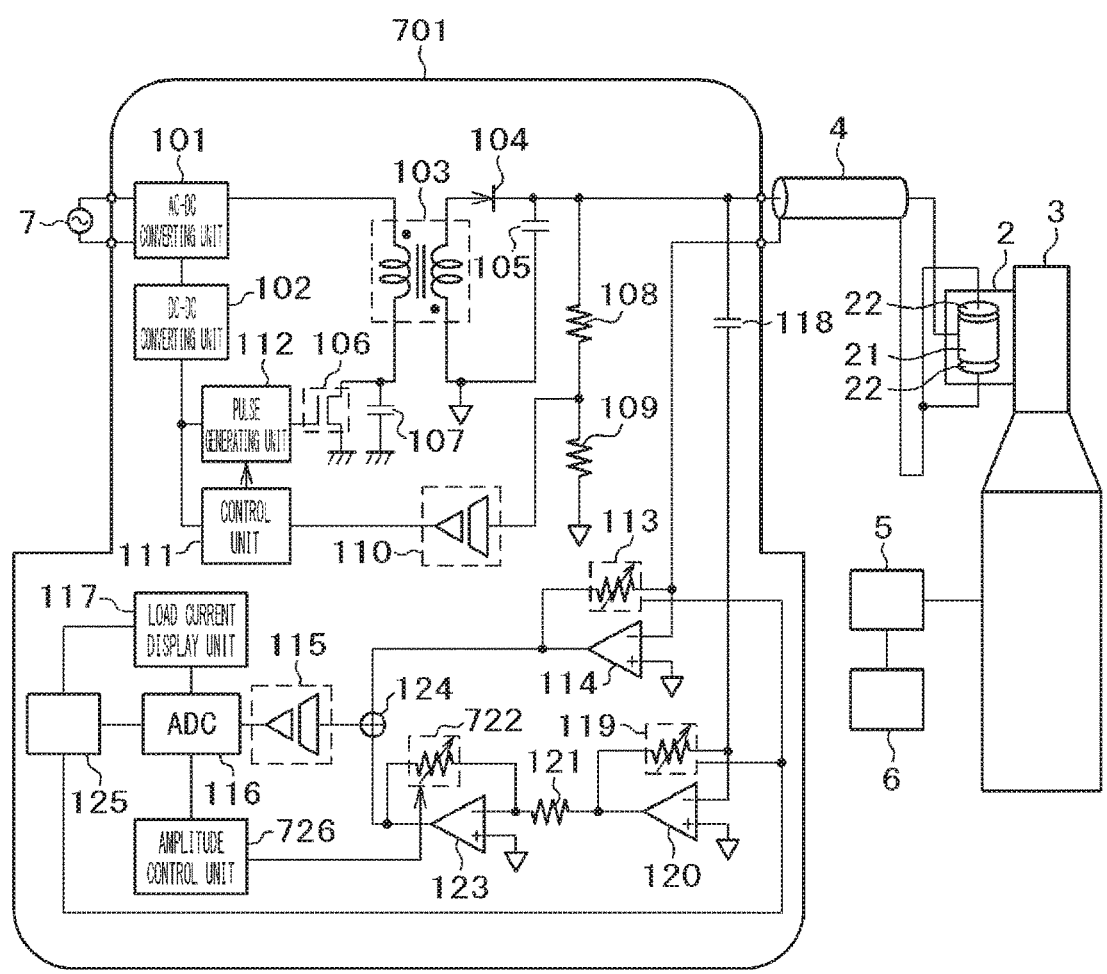

CHARGED PARTICLE BEAM DEVICE PROVIDED WITH ION PUMP

TECHNICAL FIELD

The present invention relates to a charged particle apparatus with an ion pump.

BACKGROUND ART

A charged particle beam apparatus is an apparatus for acquiring an image of a sample by irradiating the sample placed in a sample chamber which is maintained in a relatively high vacuum state with a charged particle beam. For example, in a scanning electron microscope or a transmission electron microscope, a target sample is irradiated with an electron beam as a charged particle beam, and a microscopic image of the target sample is generated based on the amount of secondary electrons or transmitted electrons detected by a detector.

In such a charged particle beam apparatus, an ion pump is used to maintain the interior of the sample chamber where a sample is placed or the interior of a lens barrel of a charged particle optical system in a high vacuum state. When the set vacuum state is to be measured using the ion pump, a current to be detected becomes weak, and thus the influence of noise cannot be ignored.

As a method for solving the problem of noise as described above, Patent Literature 1 discloses "a leakage parabolic voltage leaked from a parabolic voltage generation circuit to an operational amplifier of a pulse width control circuit via a high voltage resistance circuit is cancelled by adding a divider parabolic voltage of the same amplitude and the same phase as the leakage parabolic voltage to the operational amplifier and performing differential amplification, the divider parabolic voltage being obtained by resistor-dividing the parabolic voltage of the parabolic voltage generation circuit".

CITATION LIST

Patent Literature

[PTL 1] JP-A-11-177839

SUMMARY OF INVENTION

Technical Problem

An ion pump is used to maintain a vacuum vessel constituting a sample chamber of an electron microscope apparatus or a lens barrel of an electron optical system in an ultrahigh vacuum state. In this ion pump, by applying a high voltage between an anode and a cathode in an evacuation mechanism and applying a strong magnetic field from the outside, electrons generated from the cathode collide with gas molecules and the gas molecules are ionized, and the ions are adsorbed to the cathode or captured by an ion trap, thereby resulting an improvement of the degree of vacuum in the vacuum vessel.

In the electron microscope apparatus, it is required that the space in the lens barrel of the electron optical system on which an electron gun is mounted be in an ultrahigh vacuum ($10^{-9}$ Pa or less) state.

The degree of vacuum in the space of the lens barrel of the electron optical system is proportional to the load current flowing between the anode and the cathode in the evacuation mechanism of the ion pump, and can be measured in the evacuation mechanism of the ion pump. In order to measure the degree of vacuum in the evacuation mechanism of the ion pump, a load current detection circuit provided in a power supply of the ion pump is required to have a detection accuracy of 1 nA order indicating the ultrahigh vacuum state.

It was a problem that in the ion pump power supply, since low frequency noise (0.1 to 60 Hz) is superimposed on an output stage of a high voltage circuit, the low frequency noise is superimposed on the load current detection circuit via a cable capacitance formed between a high voltage signal line and a GND line of a high voltage cable laid between the ion pump and the ion pump power supply, and it is impossible to obtain a detection accuracy of 1 nA order, or to ensure that the space in which the electron gun is mounted is in an ultrahigh vacuum state.

As a known example relating to noise cancellation, Patent Literature 1 discloses that the leakage parabolic voltage superimposed from the parabolic voltage generation circuit to an input stage of the operational amplifier of the pulse width control circuit via the high voltage resistance circuit is cancelled by adding a divider parabolic voltage of the same amplitude and the same phase as the leakage parabolic voltage to the operational amplifier and performing differential amplification, the divider parabolic voltage being obtained by resistor-dividing the parabolic voltage of the parabolic voltage generation circuit. However, in the configuration described in Patent Literature 1, it is a problem that the leakage component cannot be reduced with a high accuracy since an impedance of the high voltage resistance circuit and that of a dividing resistor seen from the parabolic voltage generation circuit are different.

Therefore, an object of the invention is to provide a charged particle beam apparatus with an ion pump which can sufficiently reduce low frequency noise of the ion pump power supply and measure the degree of vacuum with a high accuracy.

Solution to Problem

In order to solve the problems described above, the invention provides a charged particle beam apparatus with an ion pump, including a charged particle beam irradiation detecting unit which irradiates a sample with a charged particle beam converged in a processing chamber and detects a secondary charged particle generated from the sample, an image processing unit which processes a detection signal of the secondary charged particle detected by the charged particle beam irradiation detecting unit and forms a secondary charged particle image of the sample, an output unit which performs processing at the image processing unit and outputs an image, an ion pump which maintains the interior of the processing chamber in a vacuum state, a driving power supply unit of the ion pump, and a high voltage cable which connects the ion pump and the driving power supply unit, in which the driving power supply unit of the ion pump is structured to include a high voltage power supply circuit unit which operates the ion pump, a load current detection circuit unit for detecting a load current applied to the ion pump, and a canceller circuit unit which reduces low frequency noise applied to the load current detection circuit unit.

Furthermore, in order to solve the above-mentioned problems, the invention provides a charged particle beam apparatus including an electron microscope having a lens barrel, an ion pump which maintains the interior of the lens barrel of the electron microscope in a vacuum state, and a driving power supply unit of the ion pump, in which the driving power supply unit of the ion pump is structured to include a high voltage power supply circuit unit which operates the ion pump, a load current detection circuit unit which detects a load current applied to the ion pump, and a canceller circuit unit which reduces low frequency noise applied to the load current detection circuit unit.

Advantageous Effects of Invention

According to the invention, it is possible to sufficiently reduce low frequency noise of the power supply of the ion pump and measure the degree of vacuum inside the lens barrel of the charged particle apparatus with a high accuracy. Moreover, when it is applied to an electron microscope as a charged particle apparatus, it is possible to reduce low frequency noise of the driving power supply of the ion pump, obtain a load current detection accuracy of 1 nA order in the ion pump, and ensure that the space in which the electron gun is mounted is in an ultrahigh vacuum state, thereby contributing to a high accurate measurement of the electron microscope apparatus.

BRIEF DESCRIPTION OF DRAWINGS

FIG. 2 is a block diagram showing a configuration in a case of using an electron microscope as an example of a charged particle apparatus with an ion pump in Embodiment 1 of the invention.

FIG. 3 is a block diagram showing a configuration of a power supply circuit unit of an ion pump as a comparative example of the configuration of the power supply circuit unit of the ion pump in Embodiment 1 of the invention.

FIG. 7 is a block diagram showing a schematic configuration of a charged particle apparatus with an ion pump and a configuration of a power supply circuit unit of the ion pump in Embodiment 2 of the invention.

DESCRIPTION OF EMBODIMENTS

In the charged particle apparatus with an ion pump, the invention makes it possible to reduce low frequency noise to an extent that it does not become an obstacle to the measurement of the degree of vacuum by providing a canceller circuit in the load current detection circuit provided in the power supply of the ion pump, and by setting the canceller circuit such that the impedances seen from the low frequency noise sources in the canceller circuit and a main circuit including a high voltage cable and a current voltage conversion circuit are equal to each other.

Embodiments of the invention will be described below.

Embodiment 1

In the present embodiment, description will be made to a charged particle beam apparatus with an ion pump which makes it possible to reduce low frequency noise to an extent that it does not become a problem to the measurement of the degree of vacuum, where a canceller circuit including a capacitance equal to the cable capacitance, a current voltage conversion circuit, an inverting amplifier and an adding circuit is provided, and the impedances seen from the low frequency noise sources in the canceller circuit and a main circuit including a high voltage cable and the current voltage conversion circuit are equal to each other.

Figure 1:
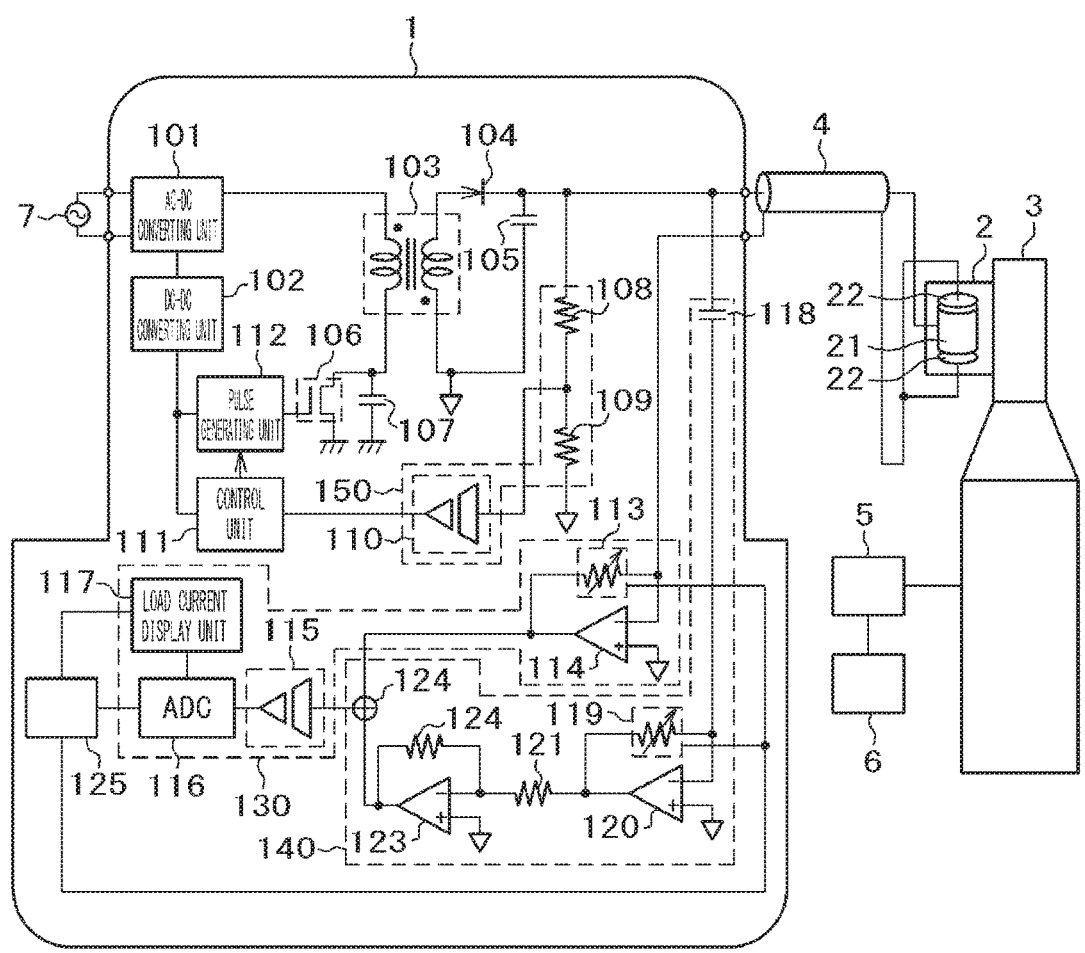
FIG. 1 is a block diagram showing a schematic configuration of a charged particle apparatus with an ion pump and a configuration of a power supply circuit unit of the ion pump in Embodiment 1 of the invention.

FIG. 1 is a diagram showing a schematic configuration of a charged particle beam apparatus 1000 with an ion pump of the embodiment.

The charged particle beam apparatus 1000 with an ion pump as shown in FIG. 1 includes an ion pump power supply 1, an ion pump 2, a charged particle beam apparatus body 3, a high voltage cable 4 connecting the ion pump power supply 1 and the ion pump 2, a total control unit 5 for controlling the whole, and an input/output unit 6 having a screen for displaying an acquired image.

As the charged particle beam apparatus body 3, a configuration of an electron microscope is shown in FIG. 2. The electron microscope 3 includes, inside a vacuum vessel (lens barrel) 30 of which the interior is capable of being evacuated to a vacuum state, an electron source 31, an extraction electrode 32 for extracting electrons generated in the electron source 31, a blanking electrode 33 for largely swinging an orbit of the beam electron extracted by the extraction electrode 32, an aperture 34 having an opening in the center part and capturing an electron beam whose orbit is greatly bent by the blanking electrode 33, a deflection electrode 35 for deflecting the electron beam passing through the opening of the aperture 34 in an X-Y direction, a convergent lens 36 for converging the electron beam passing through the deflection electrode, a table 37 on which a sample 40 is placed movable in two or three dimensional directions, and a detector 38 for detecting secondary electrons generated from the sample 40 which is irradiated with the electron beam converged by the convergent lens 36.

The electron source 31, the extraction electrode 32, the blanking electrode 33, the deflection electrode 35, the convergent lens 36 and the table 37 are respectively connected to the total control unit 5 and are controlled by the control unit 51 of the total control unit 5. A signal of the detector 38 detecting secondary electrons generated from the sample 40 which is irradiated with the electron beam is sent to the total control unit 5 to perform image processing at an image processing unit 52, and an SEM image of the sample 40 generated at the image processing unit 52 is displayed on a display screen 61 of the input/output unit 6.

The ion pump 2 is connected to the vacuum vessel 30 of the electron microscope 3 and has a configuration inside including an anode electrode 21 and a pair of cathode electrodes 22 provided on both sides of the anode electrode 21.

A general ion pump 2 runs in a range from a high vacuum state (about $10^{-3}$ Pa) to an ultrahigh vacuum state (about $10^{-9}$ Pa), and the range of the load current flowing between the anode 21 and the cathodes 22 inside an evacuation mechanism is from scores of mA to several nA. Therefore, the ion pump power supply 1 needs to stably output high voltage (DC 5 kV) over a wide load range, and a pseudo resonance flyback system is widely used.

The ion pump 2 installed on the electron microscope 3 and the ion pump power supply 1 are connected by the high voltage cable 4.

As shown in FIG. 1, the ion pump power supply 1 includes an AC-DC converting unit 101, a DC-DC converting unit 102, a flyback transformer 103, a rectifier diode 104, a rectifier capacitor 105, an MOSFET 106 for switching, a primary side resonance capacitor 107, dividing resistors 108 and 109 for voltage detection, an isolation amplifier 110 for voltage detection, a control unit 111, a pulse generating unit 112, an operational amplifier 114 for current voltage conversion, a variable resistor 113 for current voltage conversion, an isolation amplifier 115 for current detection, an A/D converter 116, a load current display unit 117, a capacitance 118 equal to the cable capacitance of the high voltage cable 4, an operational amplifier 120 for current voltage conversion, a variable resistor 119 for current voltage conversion, an operational amplifier 123 for inverting amplification, resistors 121 and 122 for inverting amplification, an adding circuit 124, and a microcomputer (μ computer) 125.

In the above-mentioned configuration, the AC-DC converting unit 101, the DC-DC converting unit 102, the flyback transformer 103, the rectifier diode 104, the rectifier capacitor 105, the MOSFET 106 for switching, the primary side resonance capacitor 107, the dividing resistors 108 and 109 for voltage detection, the isolation amplifier 110 for voltage detection, the control unit 111, and the pulse generating unit 112 form a high voltage power supply circuit unit to generate a high electric field between the anode electrode 21 and the pair of cathode electrodes 22 arranged on both sides of the anode electrode 21 of the ion pump 2 to operate the ion pump 2.

In addition, a load current detection circuit 130 for detecting a load current applied to the ion pump 2 is formed by the operational amplifier 114 for current voltage conversion, the variable resistor 113 for current voltage conversion, the isolation amplifier 115 for current detection, the A/D converter 116, and the load current display unit 117.

Moreover, the capacitance 118 equal to the cable capacitance of the high voltage cable 4, the operational amplifier 120 for current voltage conversion, the variable resistor 119 for current voltage conversion, the operational amplifier 123 for inverting amplification, the resistors 121 and 122 for inverting amplification, and the adding circuit 124 form a canceller circuit 140 which makes it possible to adjust the impedance such that the impedance seen from the low frequency noise source is equal to that of the main circuit including the high voltage cable 4 and the high voltage power supply circuit unit which is the current voltage conversion circuit, and makes it possible to reduce low frequency noise to an extent that it does not become a problem to the measurement of the degree of vacuum.

The primary side of the flyback transformer 103 is connected to the MOSFET 106 for switching and the AC-DC converting unit 101 which converts electric power supplied from a commercial AC 100 V (50/60 Hz) power supply 7 into a predetermined DC voltage, and the DC-DC converting unit 102 generates a different DC voltage from the predetermined DC voltage output by the AC-DC converting unit 101 and supplies the different DC voltage to the control unit 111 and the pulse generating unit 112.

In the ion pump power supply 1, it is necessary to separate the primary side (low voltage side) and the secondary side (high voltage side) of the flyback transformer in order to prevent malfunction caused by noise, and the isolation amplifier 110 for voltage detection and the isolation amplifier 115 for current detection are used.

Further, in order to perform a feedback control for stabilizing the output voltage, the ion pump power supply 1 has a voltage detection circuit 150 including the dividing resistors 108 and 109 for voltage detection and the isolation amplifier 110 for voltage detection, and is provided with the control unit 111 and the pulse generating unit 112. In this way, when the load current increases and the output voltage (the voltage applied to the anode 21 of the ion pump 2) decreases, the output voltage can be stabilized by increasing the pulse width of the switching pulse output by the pulse generating unit 112.

Moreover, the load current detection circuit detects the load current of the ion pump utilizing the property that the degree of vacuum in the vacuum vessel 30 is proportional to the load current flowing between the anode 21 and the cathodes 22 in the evacuation mechanism of the ion pump 2.

As a comparative example of the ion pump power supply 1 having the load current detection circuit 130 and the canceller circuit 140 of the embodiment described in FIG. 1, FIG. 3 shows a configuration of an ion pump power supply unit 301 having a load current detection circuit 330 equivalent to the load current detection circuit 130 and not having a circuit equivalent to the canceller circuit 140. The load current detection circuit 330 of the comparative example shown in FIG. 3 includes an operational amplifier 314 for current voltage conversion, a variable resistor 313 for current voltage conversion, an operational amplifier 362 for inverting amplification, resistors 360 and 361 for inverting amplification, an isolation amplifier 315 for current detection, an A/D capacitor 316, and a load current display unit 317. When the degree of vacuum in the vacuum vessel 30 is converted into a load current, it becomes 1 nA order to scores of mA. Therefore, a wide dynamic range is necessary for the load current detection circuit 330.

In the configuration as shown in FIG. 3 which has the load current detection circuit 330 and does not have the canceller circuit, the low frequency noise (0.5 to 60 Hz) superimposed on the high voltage (DC 5 kV) output by the ion pump power supply 301 sneaks to the load current detection circuit 330 via a capacitance formed between the high voltage signal line and the GND line of the high voltage cable 4, and when a minute load current of 1 nA order is being detected, it is a problem that the detection voltage is low and the minute load current cannot be detected. The causes of the low frequency noise include low frequency noise output by the isolation amplifier 110 for voltage detection, low frequency fluctuation of a reference voltage and resistance noise.

Figure 4:
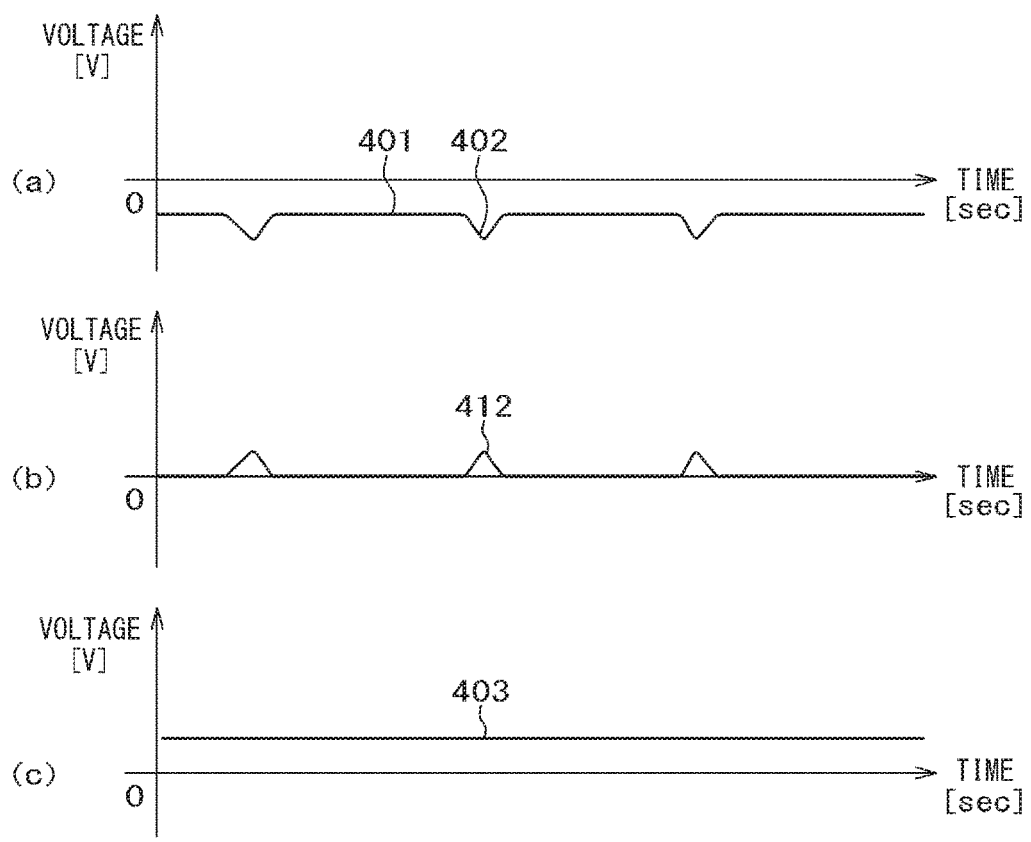
FIG. 4 is a graph of a voltage waveform observed in a load current detection circuit and a canceller circuit in Embodiment 1 of the invention.

As shown in FIG. 4(a), low frequency noise 402 sneaking via a negative DC voltage 401 indicating the load current and the high voltage cable 4 appears in the output stage of the operational amplifier 114 for current voltage conversion. Meanwhile, as shown in FIG. 4(b), in the canceller circuit 140 including the capacitance 118 equal to the cable capacitance, the operational amplifier 120 for current voltage conversion, the variable resistor 119 for current voltage conversion, the operational amplifier 123 for inverting amplification, the resistors 121 and 122 for inverting amplification, and the adding circuit 124 of FIG. 1, a signal 412 having an amplitude the same with and a phase opposite to those of the low frequency noise at the output stage of the operational amplifier 114 for current voltage conversion appears in the output stage of the operational amplifier 123 for inverting amplification. Therefore, the low frequency noise 402 is cancelled at the output stage of the adding circuit 124 and only a positive DC voltage 403 indicating the desired load current appears.

It can be seen that, compared with the configuration which only has the load current detection circuit 330 and does not have the canceller circuit as shown in FIG. 3 as a comparative example, by having the load current detection circuit 130 and the canceller circuit 140, the configuration of the embodiment as shown in FIG. 1 makes it possible to reduce the low frequency noise to an extent that the low frequency noise does not become an obstacle to the measurement of the degree of vacuum inside the vacuum vessel with a high accuracy, obtain a detection accuracy of 1 nA order, and ensure that the space in which the electron gun is mounted is in an ultrahigh vacuum state, thereby contributing to a high accurate measurement of the electron microscope apparatus.

In other words, by configuring the ion pump power supply 1 as described in the embodiment, it is possible to stably detect the range from scores of mA to several nA of the load current flowing between the anode 21 and the cathodes 22 of the ion pump 2 by the load current detection circuit 130 in the range from a high vacuum state (about $10^{-3}$ Pa) to an ultrahigh vacuum state (about $10^{-9}$ Pa) in which the ion pump 2 operates.

Description has been made in the embodiment to the ion pump power supply for switching controlling the primary side flyback transformer by using the pseudo resonance flyback system which is one of various boosting systems. However, the same effect as in the embodiment can be obtained even using other boosting systems such as a push-pull system, a half bridge system, and a full bridge system, and it is not limited to the pseudo resonance flyback system.

Figure 5:
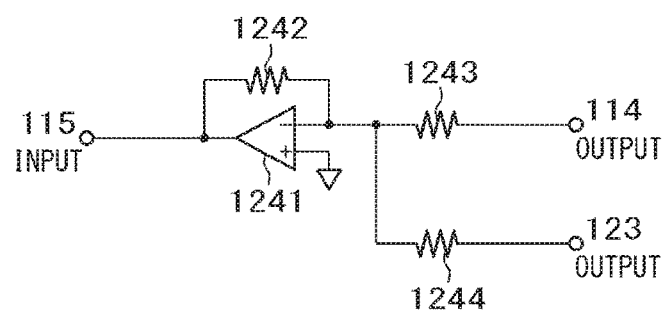
FIG. 5 is a configuration example of an adding circuit in Embodiment 1 of the invention.

Further, the adding circuit 124 of the embodiment may, for example, include an operational amplifier 1241 for addition operation, and resistors 1242, 1243 and 1244 for addition operation as shown in FIG. 5.

Figure 6A:
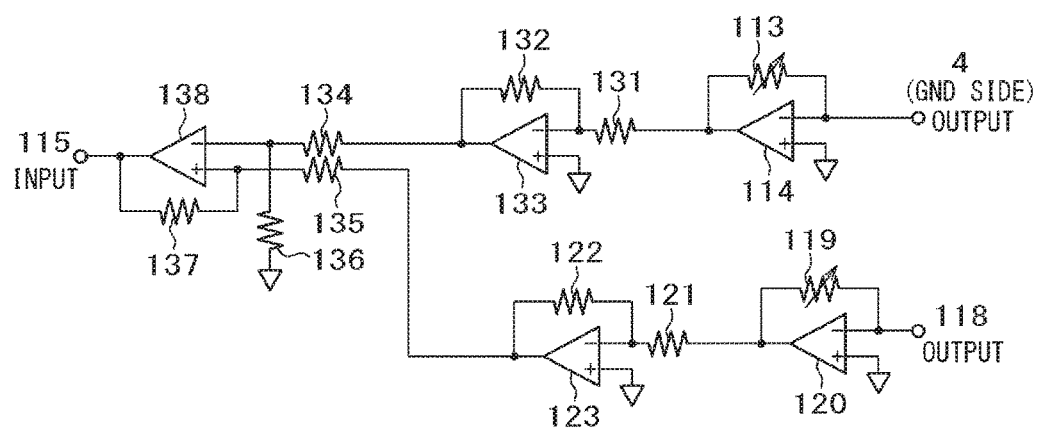
FIG. 6A is a circuit diagram showing a configuration of a load current detection circuit and a canceller circuit in a first variation of Embodiment 1 of the invention.

In addition, description has been made in the embodiment that the load current detection circuit 130 is configured by having the operational amplifier 114 for current voltage conversion, the variable resistor 113 for current voltage conversion, the isolation amplifier 115 for current detection, the A/D converter 116 and the load current display unit 117, and the canceller circuit 140 is configured by having the capacitance 118 equal to the cable capacitance, the operational amplifier 120 for current voltage conversion, the variable resistor 119 for current voltage conversion, the operational amplifier 123 for inverting amplification, the resistors 121 and 122 for inverting amplification, and the adding circuit 124. However, as shown in FIG. 6A, a positive DC voltage may be detected by arranging an operational amplifier 133 for inverting amplification, resistors 131 and 132 for inverting amplification, an operational amplifier 138 for differential amplification and resistors 134, 135, 136 and 137 for differential amplification at the output stage of the operational amplifier 114 for current voltage conversion to cancel the converted signals having an amplitude the same with and a phase opposite to those of the low frequency noise in the same phase.

Figure 6B:
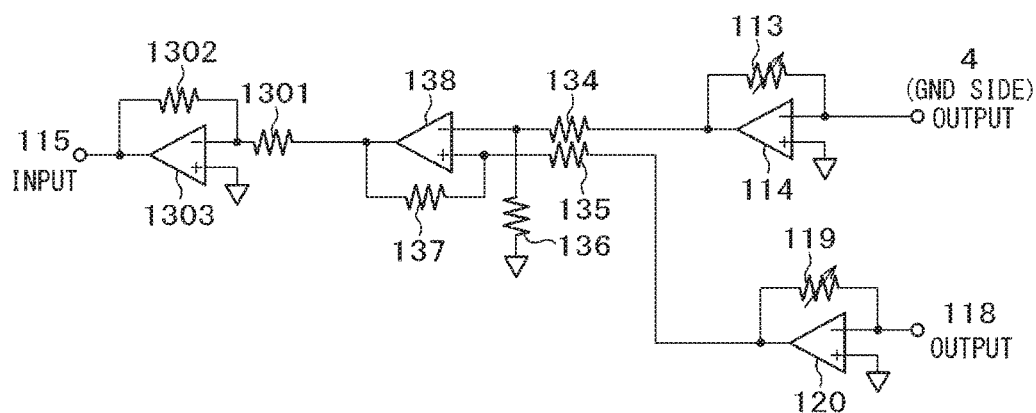
FIG. 6B is a configuration example of a load current detection circuit and a canceller circuit in a second variation of Embodiment 1 of the invention.

Further, as shown in FIG. 6B, a positive DC voltage may be detected by an operational amplifier 1303 for inverting amplification and resistors 1301 and 1302 for inverting amplification after inputting the output signals of the operational amplifier 114 for current voltage conversion and the operational amplifier 120 for current voltage conversion into the operational amplifier 138 for differential amplification and cancelling the low frequency noise.

According to the embodiment, the impedances seen from the low frequency noise sources in the canceller circuit and the main circuit including the high voltage cable and the current voltage conversion circuit of the ion pump power supply are equal to each other, which makes it possible to reduce low frequency noise to an extent that it does not become a problem to the measurement of the degree of vacuum, measure the degree of vacuum in the vacuum vessel with a high reliability, and contribute to a high accurate measurement of the electron microscope apparatus.

Description has been made to the case of using an electron microscope such as a scanning electron microscope and a transmission electron microscope as the charged particle beam apparatus body 3 in the above embodiment. However, the embodiment is not limited thereto, and it is applicable to an ion beam apparatus using an ion beam as a charged particle beam.

Embodiment 2

In the present embodiment, description will be made with reference to FIG. 7 to an ion pump power supply 701 having a function of compensating for reduction of cancelling effect, where the capacitance 118 equal to the cable capacitance of the canceller circuit 140 shown in Embodiment 1 is different from the capacitance formed between the high voltage line and the GND line of the high voltage cable 4. In FIG. 7, parts which are the same as the parts described in Embodiment 1 with reference to FIG. 1 are given the same numbers as those in FIG. 1. In addition, indications of the load current detection circuit 130 and the canceller circuit 140 are omitted.

When the capacitance formed between the high voltage line and the GND line of the high voltage cable 4 and the capacitance 118 equal to the cable capacitance of the canceller circuit are respectively 1000 pF and 2000 pF, the amplitude of the low frequency noise of the output stage of the operational amplifier 120 for current voltage conversion is twice that at the output stage of the operational amplifier 114 for current voltage conversion, whereas the phases of the low frequency noise hardly differ. Therefore, it is a problem that the cancelling effect is reduced due to the difference in capacitance.

FIG. 7 is an example of a configuration diagram of the ion pump power supply 701 of the embodiment for solving the above problem. There are two configuration components different from those of FIG. 1 of Embodiment 1: the resistor 122 for inverting amplification of FIG. 1 becomes a variable resistor 722 for inverting amplification, and an amplitude adjusting unit 726 for switching the variable resistor 722 for inverting amplification is provided such that the low frequency noise to be detected is minimized.

When the amplitude of the low frequency noise at the output stage of the operational amplifier 120 for current voltage conversion is twice that at the output stage of the operational amplifier 114 for current voltage conversion due to the difference in capacitance as mentioned above, by setting the resistance value of the variable resistor 722 for inverting amplification to half of the resistance value of the resistor 121 for inverting amplification, the low frequency noise at the output stage of the adding circuit 124 is cancelled and only a positive DC voltage indicating the desired load current appears.

When the difference between the capacitance formed between the high voltage line and the GND line of the high voltage cable 4 and the capacitance 118 equal to the cable capacitance of the canceller circuit is small, most of the low frequency noise at the output stage of the adding circuit 124 is reduced. However, the low frequency noise slightly remains. Therefore, an amplitude adjusting unit 126 may repeat the process of measurement of the remaining low frequency noise by switching the variable resistor 722 for inverting amplification such that the remaining low frequency noise is minimized.

According to the embodiment, it is possible to reduce low frequency noise with a high accuracy, obtain a detection accuracy of 1 nA order, and ensure that the space in which an electron gun is mounted is in an ultrahigh vacuum state, thereby contributing to a high accurate measurement of the electron microscope apparatus.

The invention is not limited to the above embodiments, and it includes all kinds of variations. For example, the above embodiments have been described in detail for a better understanding of the invention, and are not necessarily limited to the embodiments having all the configurations described above. Further, a part of a configuration of an embodiment can be replaced by a configuration of another embodiment, and a configuration of an embodiment can be added with a configuration of another embodiment. In addition, a part of the configuration of each embodiment can be added with, deleted or replaced with another configuration.

In addition, each of the above-described configurations, functions, processing units, processing measures and the like may be realized by hardware by, for example, designing a part or all of them with an integrated circuit. Moreover, each of the configurations, functions and the like may be realized by software by interpreting and executing a program realizing each function by a processor. Information such as a program realizing each function, a table and a file can be stored in a recording device such as a memory, a hard disk, and an SSD (Solid State Drive), or in a recording medium such as an IC card, an SD card and a DVD.

In addition, for control lines and information lines, those considered to be necessary for explanation are indicated, and not all the control lines and information lines are necessarily shown on a product. In practice, it can be considered that almost all the configurations are mutually connected.

REFERENCE SIGNS LIST

1 Ion pump power supply 2 Ion pump 3 Electron microscope apparatus 4 High voltage cable 5 Total control unit 6 Input/output unit 30 Vacuum vessel 38 Detector 101 AC-DC converting unit 102 DC-DC converting unit 103 Transformer 104 Rectifier diode 105 Rectifier capacitor 111 Control unit 112 Pulse generating unit 113 Variable resistor for current voltage conversion 114 Operational amplifier for current voltage conversion 115 Isolation amplifier for current detection 116 A/D converter 117 Load current display unit 118 Capacitance equal to the cable capacitance 119 Variable resistor for current voltage conversion 120 Operational amplifier for current voltage conversion 123, 133, 1303 Operational amplifiers for inverting amplification 124 Adding circuit 130 Load current detection circuit 140 Canceller circuit 150 Voltage detection circuit

The invention claimed is:

1. A charged particle apparatus with an ion pump, which is a charged particle beam apparatus with an ion pump comprising:

a charged particle beam irradiation detecting unit which irradiates a sample with a charged particle beam converged in a processing chamber and detecting a secondary charged particle generated from the sample, an image processing unit which processes a detection signal of the secondary charged particle detected by the charged particle beam irradiation detecting unit and forms a secondary charged particle image of the sample, an output unit which performs processing at the image processing unit and outputs an image, an ion pump which maintains an interior of the processing chamber in a vacuum state, a driving power supply unit of the ion pump, and a high voltage cable which connects the ion pump and the driving power supply unit, wherein the driving power supply unit of the ion pump includes:

a high voltage power supply circuit unit which operates the ion pump, a load current detection circuit unit which detects a load current applied to the ion pump, and a canceller circuit unit which reduces low frequency noise applied to the load current detection circuit unit.

2. The charged particle apparatus with an ion pump according to claim 1, wherein the high voltage power supply circuit unit of the driving power supply unit of the ion pump includes a transformer which has an MOS transistor at the primary side, an AC-DC converting unit which supplies a DC voltage to the primary side of the transformer, a pulse generating unit which supplies a voltage pulse to a gate of the MOS transistor at the primary side of the transformer, an output voltage detection circuit which detects an output voltage at the secondary side of the transformer, and a control unit which determines a voltage pulse width from the output voltage detected by the output voltage detection circuit.

3. The charged particle apparatus with an ion pump according to claim 1, wherein the high voltage cable has a high voltage signal line and a GND line, and the canceller circuit unit reduces the low frequency noise sneaking to the load current detection circuit via a capacitance formed between the high voltage signal line and the GND line of the high voltage cable.

4. The charged particle apparatus with an ion pump according to claim 3, wherein the canceller circuit unit includes a capacitance equal to the capacitance formed between the high voltage signal line and the GND line of the high voltage cable, a current voltage conversion circuit, an inverting amplifier and an adding circuit.

5. The charged particle apparatus with an ion pump according to claim 3, wherein the canceller circuit unit includes a capacitance equal to the capacitance formed between the high voltage signal line and the GND line of the high voltage cable, a current voltage conversion circuit, an inverting amplifier and a differential amplifier.

6. The charged particle apparatus which is an ion pump power supply for the charged particle apparatus according to claim 4, wherein, in an ion pump power supply for the charged particle beam apparatus, the canceller circuit unit further includes an amplitude control unit, the inverting amplifier of the canceller circuit unit has a variable resistor, and the amplitude control unit determines a resistance value of the variable resistor of the inverting amplifier such that the low frequency noise remaining in the load current detection circuit unit is minimized.

7. A charged particle apparatus with an ion pump, which is a charged particle beam apparatus with an ion pump comprising:

an electron microscope which has a lens barrel,
an ion pump which maintains an interior of the lens barrel of the electron microscope in a vacuum state, and
a driving power supply unit of the ion pump, wherein the driving power supply unit of the ion pump includes a high voltage power supply circuit unit which operates the ion pump,
a load current detection circuit unit which detects a load current applied to the ion pump, and
a canceller circuit unit which reduces low frequency noise applied to the load current detection circuit unit.

8. The charged particle apparatus with an ion pump according to claim 7, wherein the high voltage power supply circuit unit of the driving power supply unit of the ion pump includes a transformer which has an MOS transistor at the primary side, an AC-DC converting unit which supplies a DC voltage to the primary side of the transformer, a pulse generating unit which supplies a voltage pulse to a gate of the MOS transistor at the primary side of the transformer, an output voltage detection circuit for detecting an output voltage at the secondary side of the transformer, and a control unit which determines a voltage pulse width from the output voltage detected by the output voltage detection circuit.

9. The charged particle apparatus with an ion pump according to claim 7, wherein the charged particle apparatus with an ion pump further comprises a high voltage cable which connects the ion pump and the driving power supply unit, the high voltage cable having a high voltage signal line and a GND line, and the canceller circuit unit reduces the low frequency noise sneaking to the load current detection circuit via a capacitance formed between the high voltage signal line and the GND line of the high voltage cable.

10. The charged particle apparatus with an ion pump according to claim 9, wherein the canceller circuit unit includes a capacitance equal to the capacitance formed between the high voltage signal line and the GND line of the high voltage cable, a current voltage conversion circuit, an inverting amplifier and an adding circuit.

11. The charged particle apparatus with an ion pump according to claim 9, wherein the canceller circuit unit includes a capacitance equal to the capacitance formed between the high voltage signal line and the GND line of the high voltage cable, a current voltage conversion circuit, an inverting amplifier and a differential amplifier.

12. The charged particle apparatus which is an ion pump power supply for the charged particle apparatus according to claim 11, wherein, in an ion pump power supply for the charged particle beam apparatus, the canceller circuit unit further includes an amplitude control unit, the inverting amplifier of the canceller circuit unit has a variable resistor, and the amplitude control unit determines a resistance value of the variable resistor of the inverting amplifier such that the low frequency noise remaining in the load current detection circuit unit is minimized.

* * * * *